(12) United States Patent
Ladebeck

(10) Patent No.: US 6,215,382 B1
(45) Date of Patent: Apr. 10, 2001

(54) DEVICE FOR GENERATING A MAGNETIC FIELD IN AN AIR GAP

(75) Inventor: Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/448,399

(22) Filed: Nov. 23, 1999

(30) Foreign Application Priority Data

Nov. 25, 1998 (DE) .............................................. 198 54 483

(51) Int. Cl.[7] .......................................................... H01F 3/00
(52) U.S. Cl. ............................................................. 335/297
(58) Field of Search ................................... 335/296–306; 324/318, 319, 320; 336/234

(56) References Cited

U.S. PATENT DOCUMENTS 5,283,544 * 2/1994 Sakurai et al. ........................ 335/297
5,317,297 5/1994 Kaufman et al. ..................... 335/297

FOREIGN PATENT DOCUMENTS 0 691 548  1/1996 (EP) .
0 479 514  7/1998 (EP) .

* cited by examiner

*Primary Examiner*—Ramon M. Barrera
(74) *Attorney, Agent, or Firm*—Schiff Hardin & Waite

(57) ABSTRACT

A device for generating a magnetic field in an air gap, particularly for a magnetic resonance apparatus, has a pair of magnetic poles arranged opposite one another with the air gap therebetween. Each magnetic poles plate constructed of a number of layers successively lying on top of one another and electrically insulated from one another. Each layers is formed by plate-shaped elements of magnetically permeable material arranged next to one another and electrically insulated from one another. Successive layers are arranged offset relative to one another in-layer directions.

9 Claims, 2 Drawing Sheets

DEVICE FOR GENERATING A MAGNETIC FIELD IN AN AIR GAP

BACKGROUND OF THE INVENTION

1. Field of the Invention

The present invention is directed to a device for generating a magnetic field in an air gap, particularly for a magnetic resonance apparatus, of the type having a pair of magnetic poles arranged disposed opposite one another between which the air gap is located, each of the magnetic poles having a pole plate constructed of a number of layers lying on top of one another and electrically insulated from one another.

2. Description of the Prior Art

A device of the type described above is disclosed in European Application 0 479 514. A magnetic field having high field strength and which satisfies high demands as to homogeneity is generated with a pair of magnetic poles arranged lying opposite one another, the field being generated in an air gap lying therebetween. Such a device is used for a diagnostic magnetic resonance apparatus. The air gap is generally of such a size that a patient for examination can be placed between the poles after the installation of the other components. The magnetic poles also include a magnetic drive, for example in the form of permanent magnets or electromagnetic coils as well. For the flux return, the magnets are connected via a yoke composed of highly magnetically permeable material.

In imaging with magnetic resonance, gradient coils are required that are secured to the magnetic poles and that generate respective magnetic gradient fields in the x-direction, y-direction and z-direction. Location information is superimposed on the magnetic resonance signal by means of these magnetic gradient fields. The magnetic gradient fields are usually generated by current pulses that have the side-effect of inducing eddy currents in adjoining, electrically conductive regions. The induced eddy currents in turn distort the gradient field in the air gap.

For reducing these induced eddy currents, the magnetic poles disclosed in European Application 0 479 514 have pole plates that are constructed of individual blocks, the blocks themselves being composed of a number of electrically insulated layers of non-oriented silicon steel sheet. This structuring is generally adequate, but the fabrication is complicated. The blocks must be individually mounted on a carrier, which can only thereafter be connected to the magnetic pole. The magnetic properties are not optimum due to the small gaps between the individual blocks.

European Application 0 691 548 discloses that plate-shaped "soft ferrites" also can be employed in pole plates.

U.S. Pat. No. 5,317,297 discloses pole plates for the basic field magnet of a magnetic resonance apparatus that are composed of relatively large rod-shaped elements. It is stated therein that even a single layer composed in this way effects a significant reduction of eddy currents. Two layers that are orientated 90° relative to one another, however, are more mechanically stable and tend toward a more uniform distribution of the eddy current effects.

SUMMARY OF THE INVENTION

An object of the present invention is to provide a device for generating a magnetic field that has pole plates with uniform magnetic properties that are simple to manufacture.

This object is inventively achieved in a device for generating a magnetic field in an air gap located between oppositely disposed pole pieces, each formed by layers composed of elements of magnetically conductive material that are plate-shaped, which are arranged next to one another and are electrically insulated from one another, wherein successive layers are arranged offset relative to one another in-layer directions. The magnetic properties are more uniform compared to the convention structure that employs individual blocks because the inventive pole plates do not have any gaps which extend through the pole plate. When manufacturing the pole plates, one level is first occupied with the plate-shaped elements. An electrical insulator, for example epoxy resin, is then applied. A further layer with plate-shaped elements is then placed thereon. The second layer with plate-shaped elements is arranged offset relative to the first layer. This is continued until the desired plate thickness has been achieved. As a result of this structure, a pole plate arises that is stable in and of itself so it can be simply secured to the magnetic poles. The pole plates need not be glued to the magnetic poles; they can be disassembled at any time.

In one embodiment at least one of the pole plates has elevations and/or depressions on one surface. A basic shim for making the basic magnetic field more uniform thus can already be taken into consideration in the manufacture of the pole plate. Often, the ideally uniform basic magnetic field is distorted by an asymmetrical design of the magnetic feedbacks. These design-caused distortions are always the same in terms of their type. Once they have been measured, they can be reduced by a correspondingly fashioned pole plate surface. Additionally, an interactive shim can be implemented by corresponding recesses of the pole plate surface by a material removing shaping (for example, milling).

DESCRIPTION OF THE PREFERRED EMBODIMENTS

Figure 1:
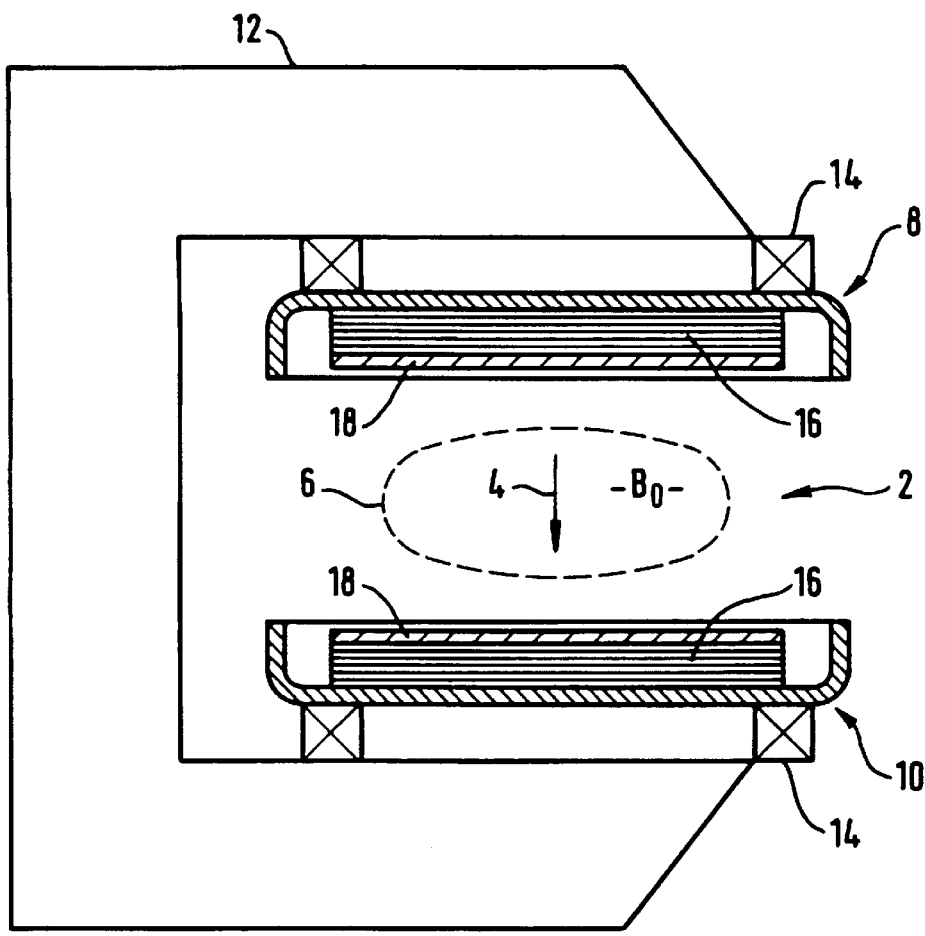
FIG. 1 is a sectional view showing the structure of a device for generating a magnetic field for a magnetic resonance apparatus having the inventive pole plates.

In a side view, FIG. 1 shows a section through the basic structure of a device for generating a magnetic field in an air gap 2. The device is fashioned for generating a highly uniform magnetic field $B_0$ in a diagnostic magnetic resonance apparatus. The magnetic field direction is illustrated with an arrow 4. The field strength in the uniform region, which is located approximately in the middle of the air gap, lies, for example, on the order of magnitude of 0.5 Tesla. The air gap 2 is dimensioned such that, after installation of the components needed for the magnetic resonance imaging, there is still enough space to accept a patient 6. The broken line is intended to show the approximate contour of the cross-section of the patient.

The air gap is located between two magnetic poles 8 and 10 that are connected to one another via a magnetic return 12 disposed next to the air gap 2. In the lateral illustration, the device for generating a magnetic field is similar to the letter C; it is therefore also referred to as a C-magnet. The two magnetic poles 8 and 10 have respective magnetic drives 14, fashioned here as normally conductive electromagnetic coils, and must be excited with corresponding currents. Alternatively, each magnetic drive 14 can be realized in the form of permanent magnets or of superconducting electromagnetic coils.

The magnetic poles 8 and 10 also include respective pole plates 16 that are connected to the magnetic drives 14 in a magnetic field-coupled fashion. The pole plates 16 are constructed of layers lying on top of one another and electrically insulated from one another, as subsequently described with reference to FIG. 2. Gradient coils 18 are also secured on the pole plates 16 in the direction of the air gap 2, these gradient coils 18 generating magnetic gradient fields in all three spatial directions in the air gap 2.

Figure 2:
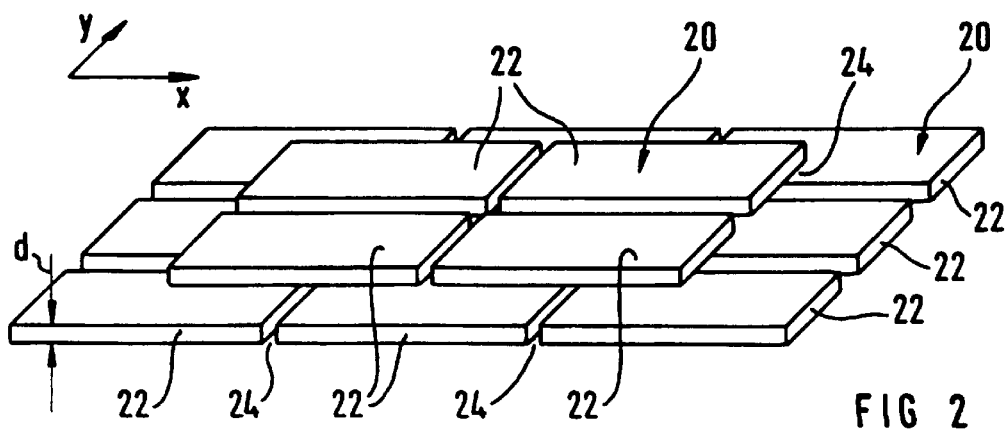
FIG. 2 is a perspective view showing the layer structure of an inventive pole plate.

FIG. 2 shows the structure of the pole plates 16. The pole plates 16 are constructed of layers 20 that successively lie on top of one another and are electrically insulated from one another. For clarity, FIG. 2 shows only two layers 20 excerpted. Each layer 20 is composed of plate-shaped elements 22 arranged next to one another and electrically insulated from one another that are composed of a magnetically permeable material. Only a few elements 22 are shown here; the arrangement, however, continues over the entire width or over the entire diameter of the pole plates 16. The elements 22 are rectangularly implemented here; however, it is likewise possible to implement the elements 22 in a layer quadratically, for example, or hexagonally. The elements 22 are of the same size and typically have a thickness d of 1 mm. Their expanse in the layer 20 amounts to approximately 20 mm through 100 mm. The individual elements 22 are separated from one another by gaps 24. The width of the gap 24 is set such that the elements 22 are sure to be electrically separated from one another. A gap 24 on the same order of magnitude as between the individual elements 22 within the layers 20 is likewise present between the individual layers 20. The gaps or interspaces 24 are filled with an insulator. For example, a first level is occupied with the elements 22 in the manufacture of the pole plates 16. Epoxy resin is then painted thereover as insulator. A further layer with elements 22 is then placed thereon, this then forming the second layer 20. The elements 22 of the layers 20 lying on top of one another are thereby arranged offset relative to one another, in in-layer directions so that the interspaces 24 between the elements 22 of a layer 20 are covered by elements 22 of the layer 20 lying thereabove and, if present, of the layer 20 lying therebelow. The elements 22 of the layers 20 are offset here in two directions x, y residing perpendicularly on one another, being respectively offset by half the element width. Overall, a pole plate 16 is constructed of approximately fifteen through forty layers, dependent on the magnetic field strength, so that a pole plate thickness of 2 through 5 cm arises. As a result of this structure, the pole plate 16 is inherently or intrinsically stable and can be easily installed into the magnetic poles 8 and 10 as an individual component. The fine subdivision and offset arrangement of the elements 22 within the layers 20 also causes the magnetic properties to be highly uniformly distributed.

A non-oriented silicon steel plate is utilized as the material for the elements 22, this having a high specific electrical resistance, so that eddy currents induced therein have only a slight amplitude. The actual gradient field required for the spatial resolution of the magnetic resonance signals is thus largely undistorted.

Figure 3:
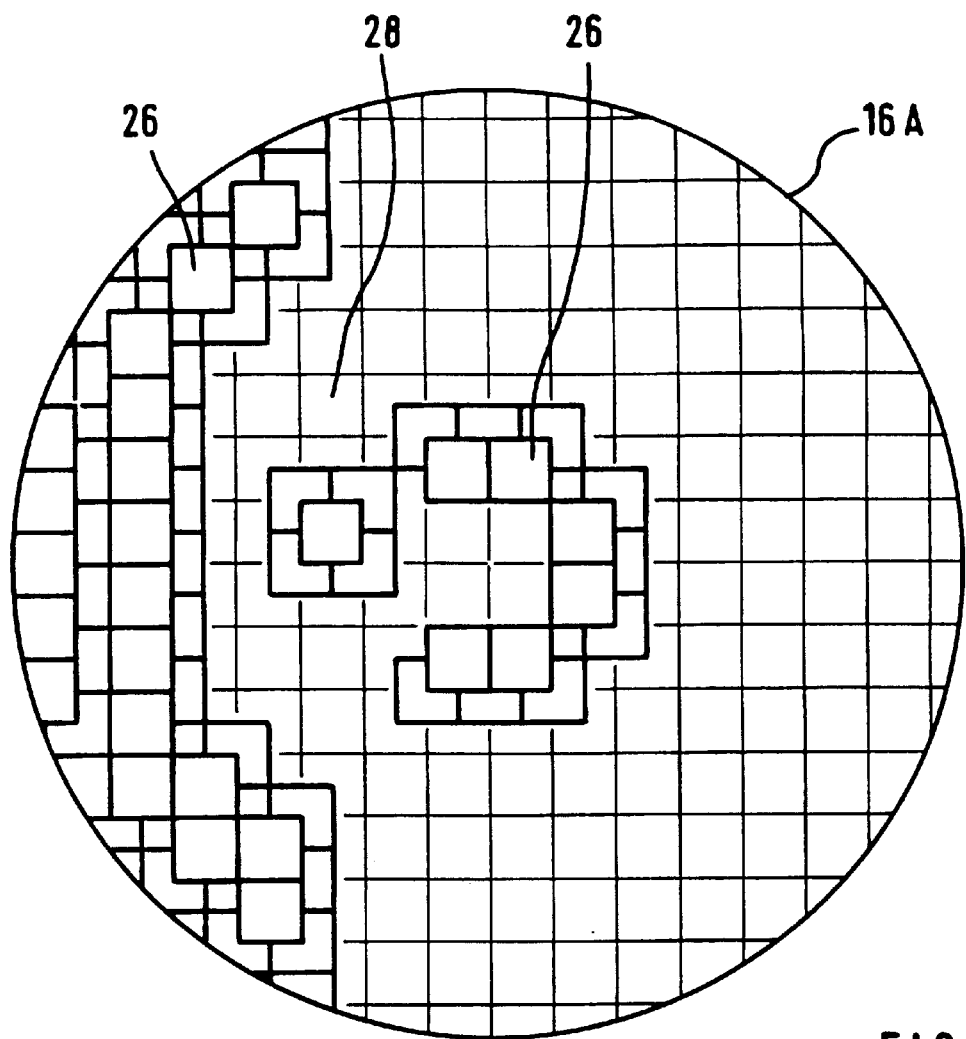
FIG. 3 is a plan view showing an inventive pole plate with slight elevations that effect a basic shim.

FIG. 3 shows a plan view of a pole plate 16A that has elevations 26 and depressions 28 at the side facing toward the air gap 2 for shimming the basic magnetic field $B_0$. The elevations 26 are firmly connected to the rest of the pole plate 16A and are constructed layer-by-layer in the same way as the remaining pole plate 16A and as already set forth with reference to FIG. 2. The elevations 26 are arranged such that the distortion of the uniform magnetic field Bo caused by the design structure of the overall magnet is largely compensated. The arrangement and the structure of the magnetic return 12 has a significant influence on the distortions of the basic magnetic field Bo. Here, it is mainly the pole plate sections that face toward the magnetic return 12 after installation that are provided with elevations 26.

Figure 4:
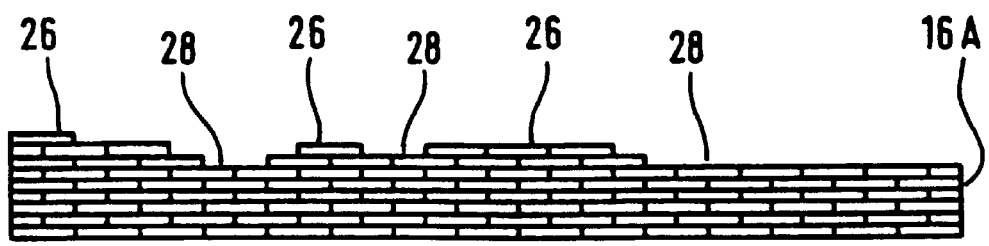
FIG. 4 is a sectional view showing the cross-section of the pole plate of FIG. 3

The elevations 26 are composed of one or more layers 20, as shown in FIG. 4 in section. Here, as well, the elements 22 of successive layers 22 are arranged offset relative to one another.

Instead of applying additional layers 20 for constructing the elevations 26, a uniformly thick pole plate 16 having a maximally possible thickness can be initially fabricated, the depressions 28 being then subsequently introduced thereinto. The shimming procedure can then ensue iteratively by removing selected material from the pole plate 16, 16A, for example by milling, after measuring the deviations from the required uniformity of the basic magnetic field $B_0$. The locations and amount of material to be removed in order to improve the homogeneity is calculated based on the measurement. It is also possible to apply known shimming methods at the pole plates 16 in addition to the magnetic shim by, for example, positioning permanent magnets and/or iron elements on the surface of the pole plates 16, 16A. The magnetic field can be made even more uniform with a further shim by means of electromagnetic coils.

Although modifications and changes may be suggested by those skilled in the art, it is the intention of the inventor to embody within the patent warranted hereon all changes and modifications as reasonably and properly come within the scope of his contribution to the art.

I claim as my invention:

1. A device for generating a magnetic field having a field direction in an air gap, comprising a pair of magnetic poles disposed opposite one another with an air gap therebetween, each of said magnetic poles comprising a pole plate formed by a plurality of layers successively lying on top of one another and electrically insulated from one another, each of said layers comprising a plurality of plate-shaped elements of magnetically permeable material arranged next to one another and electrically insulated from one another, and said elements respectively in each of said layers being disposed parallel to said elements in a next successive layer, and offset relative to said elements in a next successive layer in in-layer directions substantially orthogonal to said field direction.

2. A device according to claim 1, wherein the plate-shaped elements are identical.

3. A device according to claim 2, wherein the layers are offset relative to one another respectively by half an element width in at least one of said in-layer directions.

4. A device according to claim 1, wherein the plate-shaped elements are rectangular.

5. A device according to claim 1 wherein the elements are connected to one another with an insulator.

6. A device according to claim 5, wherein the elements are connected to one another with an epoxy resin.

7. A device according to claim 1 wherein at least one of the pole plates comprises selected thickness variations on one surface.

8. A device according to claim 7, said thickness variation comprise elevations formed by a plurality of said layers lying on top of one another having respectively different extents in said in-layer directions.

9. A device according to claim 7, wherein said thickness variations comprise depressions worked into the pole plate as recesses.

* * * * *